US010644154B2

(12) United States Patent
Ching et al.

(10) Patent No.: US 10,644,154 B2
(45) Date of Patent: *May 5, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Zhubei (TW); Ching-Wei Tsai, Hsinchu (TW); Chih-Hao Wang, Baoshan Township (TW); Wai-Yi Lien, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/174,196

(22) Filed: Oct. 29, 2018

(65) Prior Publication Data

US 2019/0067482 A1 Feb. 28, 2019

Related U.S. Application Data

(62) Division of application No. 15/409,014, filed on Jan. 18, 2017, now Pat. No. 10,115,823, which is a (Continued)

(51) Int. Cl.
*H01L 29/66* (2006.01)
*H01L 29/78* (2006.01)
(Continued)

(52) U.S. Cl.
CPC ...... *H01L 29/7848* (2013.01); *H01L 21/0228* (2013.01); *H01L 21/02236* (2013.01);
(Continued)

(58) Field of Classification Search
CPC .................................. H01L 29/66795
See application file for complete search history.

(56) References Cited

U.S. PATENT DOCUMENTS 7,425,740 B2 9/2008 Liu et al.
8,048,723 B2 11/2011 Chang et al.
(Continued)

OTHER PUBLICATIONS

Non-Final Office Action U.S. Appl. No. 14/687,815 dated Jun. 2, 2016.
(Continued)

*Primary Examiner* — Peniel M Gumedzoe
*Assistant Examiner* — Christopher A Johnson
(74) *Attorney, Agent, or Firm* — McDermott Will & Emery LLP

(57) ABSTRACT

A method for manufacturing a semiconductor device includes forming a fin structure including a well layer, an oxide layer disposed over the well layer and a channel layer disposed over the oxide layer. An isolation insulating layer is formed so that the channel layer of the fin structure protrudes from the isolation insulating layer and a part of or an entirety of the oxide layer is embedded in the isolation insulating layer. A gate structure is formed over the fin structure. A recessed portion is formed by etching a part of the fin structure not covered by the gate structure such that the oxide layer is exposed. A recess is formed in the exposed oxide layer. An epitaxial seed layer in the recess in the oxide layer. An epitaxial layer is formed in and above the recessed portion. The epitaxial layer is in contact with the epitaxial seed layer.

20 Claims, 18 Drawing Sheets

Related U.S. Application Data division of application No. 14/687,815, filed on Apr. 15, 2015, now Pat. No. 9,590,102.

(51) Int. Cl.

| | | |
|---|---|---|
| *H01L 29/40* | (2006.01) | |
| *H01L 29/51* | (2006.01) | |
| *H01L 29/16* | (2006.01) | |
| *H01L 21/02* | (2006.01) | |
| *H01L 21/762* | (2006.01) | |
| *H01L 29/06* | (2006.01) | |
| *H01L 29/165* | (2006.01) | |

(52) U.S. Cl.
CPC .. *H01L 21/02524* (2013.01); *H01L 21/02645* (2013.01); *H01L 21/7624* (2013.01); *H01L 29/0638* (2013.01); *H01L 29/1604* (2013.01); *H01L 29/401* (2013.01); *H01L 29/51* (2013.01); *H01L 29/517* (2013.01); *H01L 29/66795* (2013.01); *H01L 29/66818* (2013.01); *H01L 29/785* (2013.01); *H01L 21/02529* (2013.01); *H01L 21/02532* (2013.01); *H01L 29/165* (2013.01); *H01L 29/1608* (2013.01)

(56) References Cited

U.S. PATENT DOCUMENTS

| | | | |
|---|---|---|---|
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2004/0026736 A1* | 2/2004 | Grupp | H01L 21/28537 257/330 |
| 2005/0199872 A1* | 9/2005 | Roy | H01L 21/0237 257/19 |
| 2006/0048702 A1 | 3/2006 | Son et al. | |
| 2010/0148217 A1 | 6/2010 | Simonelli et al. | |
| 2013/0234203 A1* | 9/2013 | Tsai | H01L 29/66795 257/190 |
| 2013/0285153 A1 | 10/2013 | Lee et al. | |
| 2014/0183600 A1 | 7/2014 | Huang et al. | |
| 2014/0197458 A1 | 7/2014 | Ching et al. | |
| 2014/0264590 A1 | 9/2014 | Yu et al. | |
| 2014/0264592 A1 | 9/2014 | Oxland et al. | |
| 2014/0353731 A1 | 12/2014 | Colinge et al. | |
| 2015/0021691 A1 | 1/2015 | Akarvardar et al. | |

OTHER PUBLICATIONS

Notice of Allowance U.S. Appl. No. 14/687,815 dated Oct. 11, 2016.

Korean Office Action issued in parent corresponding Korean Patent Application No. 10-2015-0166137 dated Dec. 6, 2016 with English Translation.

Office Action Taiwanese Patent Application No. 10520994910 dated Aug. 11, 2016.

Non-final Office Action issued in related U.S. Appl. No. 15/409,014, dated Jan. 12, 2018.

Notice of Allowance issued in related U.S. Appl. No. 15/409,014, dated Jun. 6, 2018.

* cited by examiner

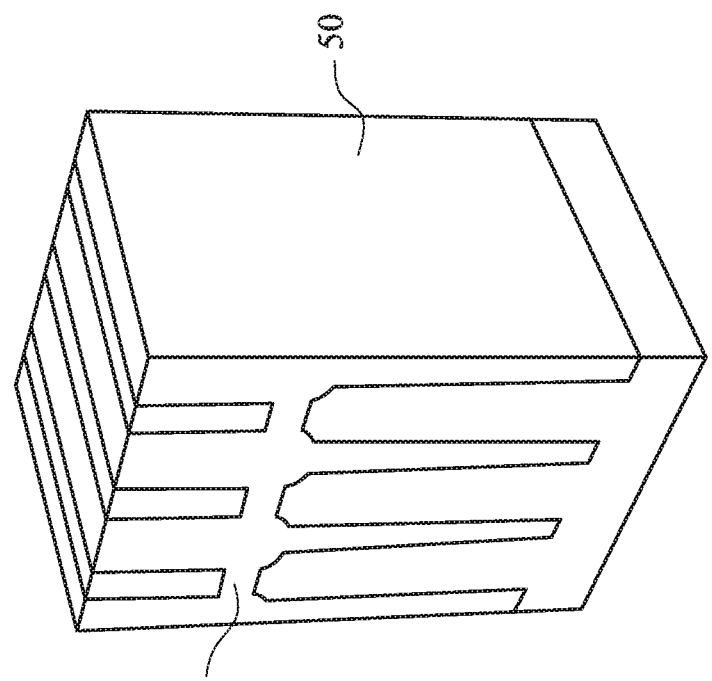
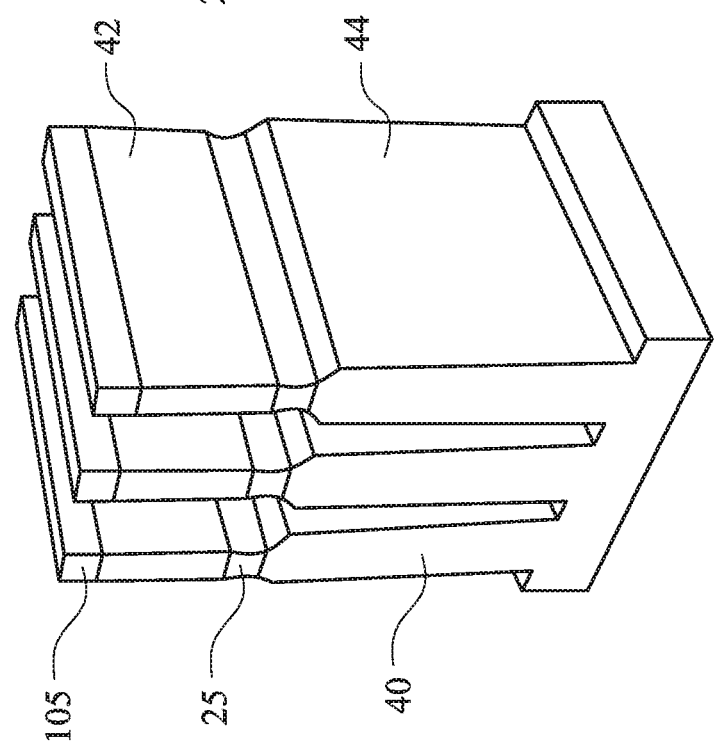

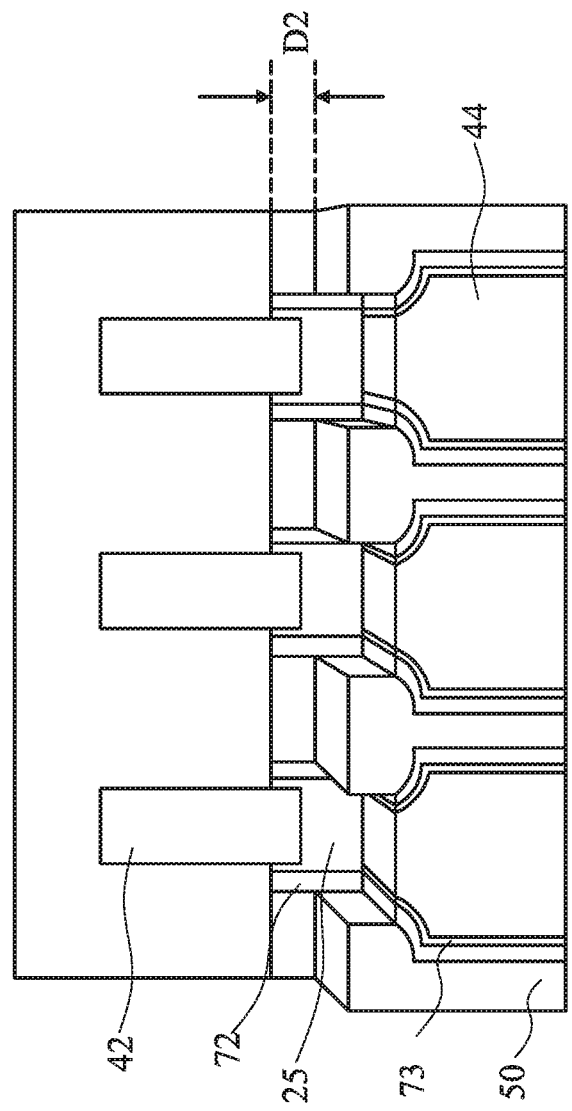

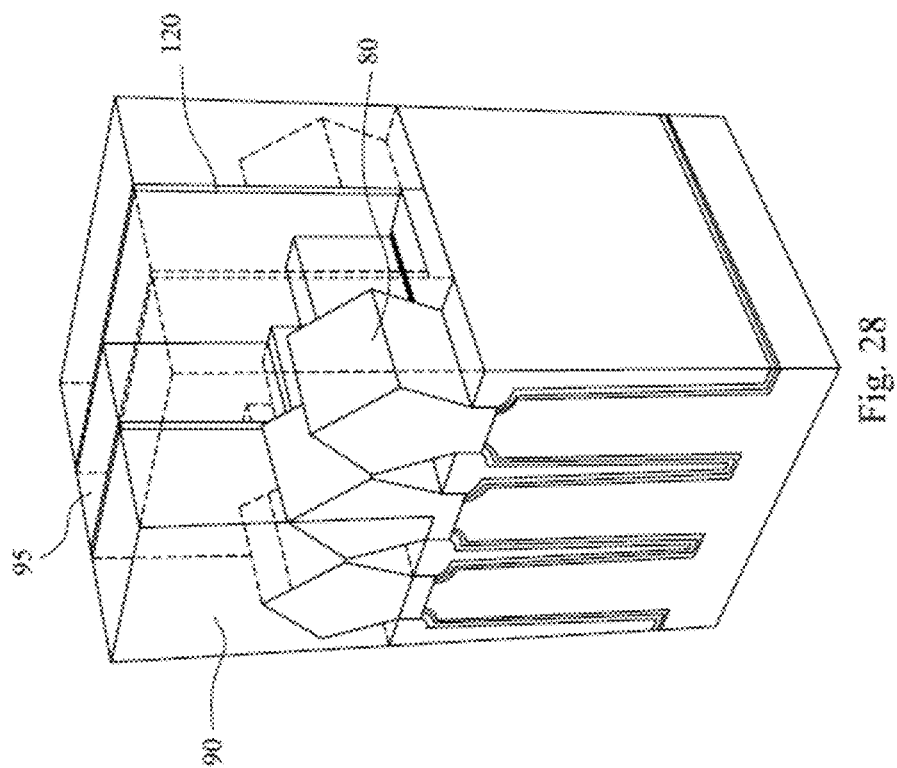

SEMICONDUCTOR DEVICE AND MANUFACTURING METHOD THEREOF

CROSS REFERENCE TO RELATED APPLICATIONS

This application is a Divisional Application of U.S. Ser. No. 15/409,014, filed Jan. 18, 2017, which is a Divisional Application of U.S. Ser. No. 14/687,815, filed Apr. 15, 2015, the subject matter of which is incorporated herein by reference in entirety.

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility. Further, channel on oxide structures have been proposed to improve carrier mobility and to maintain a straight fin profile.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1-18 are exemplary processes for manufacturing a semiconductor FET device having a fin structure (Fin FET) according to one embodiment of the present disclosure.

FIGS. 21-28 are exemplary processes for manufacturing a semiconductor FET device having a fin structure according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-18 show exemplary processes for manufacturing a semiconductor FET device having a fin structure (Fin FET). It is understood that additional operations can be provided before, during, and after operations shown by FIGS. 1-18, and some of the operations described below can be replaced or eliminated, for additional embodiments of the method. The order of the operations may be interchangeable.

Figure 1:
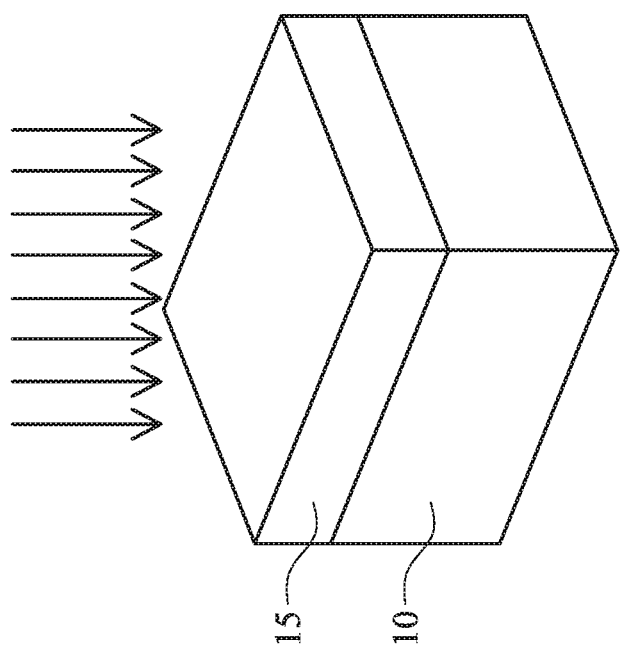

In FIG. 1, impurity ions (dopants) are implanted into a silicon substrate 10 to form a well region 15. The ion implantation is performed to prevent a punch-through effect.

The substrate 10 is, for example, a p-type silicon substrate with an impurity concentration in a range of about $1.12 \times 10^{15}$ $cm^{-3}$ and about $1.68 \times 10^{15}$ $cm^{-3}$. In other embodiments, The substrate 10 is an n-type silicon substrate with an impurity concentration in a range of about $0.905 \times 10^{15}$ $cm^{-3}$ and about $2.34 \times 10^{15}$ $cm^{-3}$.

Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The dopants are, for example boron ($BF_2$) for an n-type Fin FET and phosphorus for a p-type Fin FET.

Figure 2:
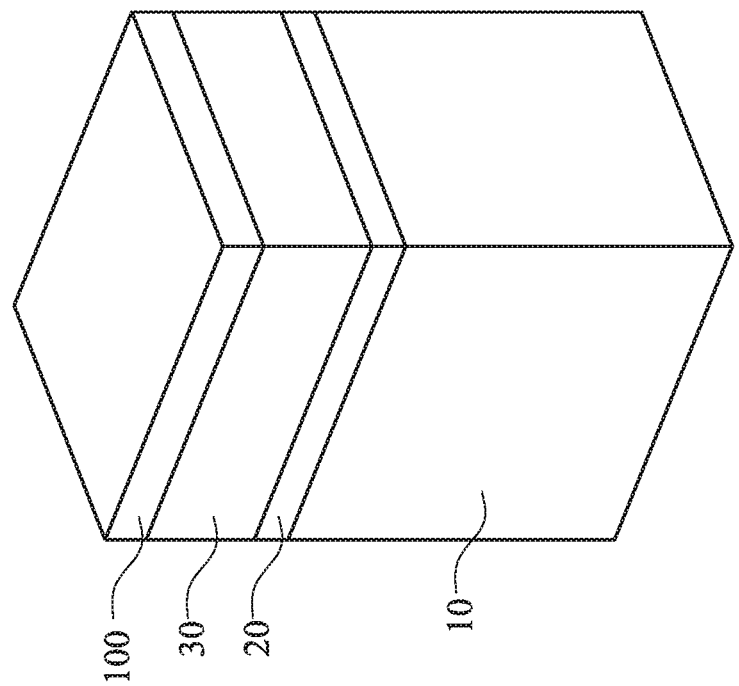

As shown in FIG. 2, a first epitaxial layer 20 is epitaxially grown over the surface of the substrate 10, and a second epitaxial layer 30 is epitaxially grown over the first epitaxial layer. Further, a mask layer 100 is formed over the second epitaxial layer 30.

The first epitaxial layer 20 may be, for example Ge or $Si_{(1-x)}Ge_x$, where x is in a range of about 0.1 to about 0.9. In this embodiment, $Si_{(1-x)}Ge_x$ is used as the first epitaxial layer. In the present disclosure, $Si_{1-x}Ge_x$ may be simply referred to as SiGe. The thickness of the SiGe first epitaxial layer 20 is in a range of about 10 nm to about 100 nm in some embodiments. In certain embodiments, the thickness of the SiGe first epitaxial layer 20 is in a range of about 1 nm to about 20 nm, or in a range of about 2 nm to 10 nm in other embodiments.

The second epitaxial layer 30 may be, for example Si or $Si_{(1-y)}Ge_y$, where y<x. The second epitaxial layer is Si in this embodiment. The Si second epitaxial layer 30 has a thickness in a range of about 20 nm to about 70 nm in some embodiments. In certain embodiments, the thickness of the Si second epitaxial layer 30 is in a range of about 30 nm to about 50 nm.

The mask layer 100 may include, for example, a pad oxide (e.g., silicon oxide) layer and a silicon nitride (SiN) mask layer in some embodiments. The thickness of the pad oxide layer is in a range of about 2 nm to about 15 nm and the thickness of the silicon nitride mask layer is in a range of about 10 nm to about 50 nm in some embodiments. The mask layer is SiN in this embodiment.

By using patterning operations, the mask layer 100 is patterned into mask patterns 105. The width of each of the patterns 105 is in a range of about 5 nm to about 40 nm in some embodiments, or may be in a range of about 10 nm to about 30 nm in other embodiments.

Figure 3:
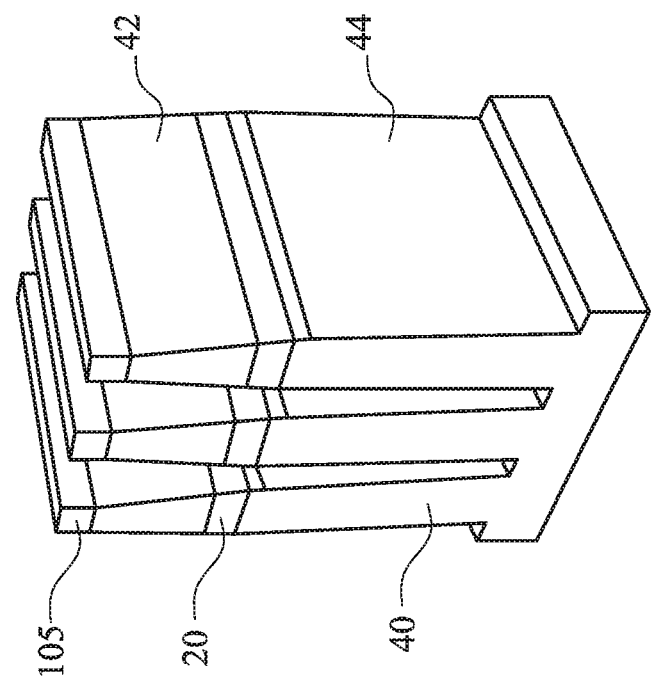

As shown in FIG. 3, by using the mask patterns 105 as etching masks, the Si second epitaxial layer 30, the SiGe first epitaxial layer 20 and the Si substrate 10 are patterned into fin structures 40 by trench etching using a dry etching method and/or a wet etching method.

As shown in FIG. 3, three fin structures 40 are disposed adjacent to each other. However, the number of the fin structures is not limited to three. The numbers may be one, two, four or five or more. In addition, one or more dummy fin structures may be disposed adjacent to both sides of the fin structures 40 to improve pattern fidelity in patterning processes. The width of the fin structure 40 is in a range of about 5 nm to about 40 nm in some embodiments, and may be in a range of about 7 nm to about 15 nm in certain embodiments. The height of the fin structure 40 is in a range of about 100 nm to about 300 nm in some embodiments, and may be in a range of about 50 nm to 100 nm in other embodiments. The space between the fin structures 40 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits.

Figure 4:
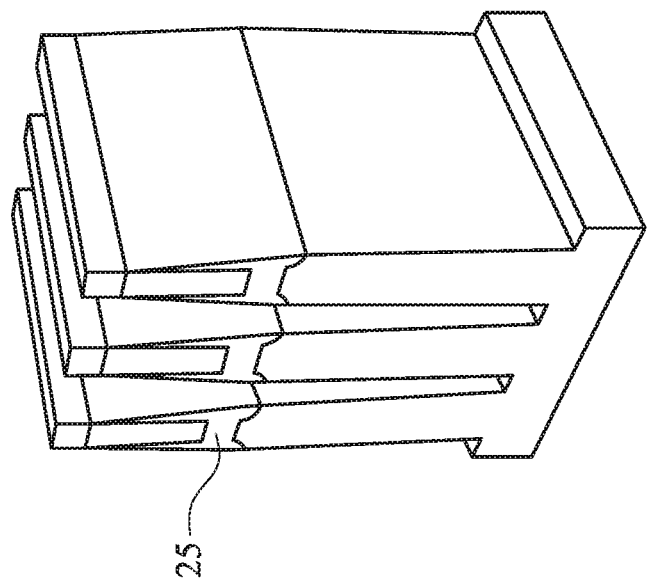

As shown in FIG. 4, the SiGe first epitaxial layers 20 in the fin structures 40 are oxidized to form SiGe oxide layers 25. Since SiGe (in particular Ge) is oxidized faster than Si, the SiGe oxide layers 25 can be selectively formed. However, side walls of the Si first epitaxial layer 30 and the Si substrate 10 may also be slightly oxidized to form silicon oxide. The SiGe layer can be oxidized by an annealing or heating in an atmosphere containing oxygen ($O_2$), $O_2$ and hydrogen ($H_2$) or steam ($H_2O$). In this embodiment, wet oxidation using steam is performed at a temperature range of about 400° C. to about 600° C., at about atmospheric pressure. The thickness of the SiGe oxide layer is in a range of about 5 nm to 25 nm in some embodiments, or about 10 nm to 20 nm in other embodiments.

As shown in FIG. 5, part of the SiGe oxide layer 25 is removed, by using, for example, wet etching. The etchant of the wet etching may be dilute HF. By adjusting the etching conditions (e.g., etching time), the silicon oxide formed on the side walls of the Si first epitaxial layer 30 and the Si substrate 10 is removed. The SiGe oxide layer 25 is also slightly etched.

Next, an isolation insulating layer 50 is formed. The isolation insulating layer 50 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total. The isolation insulating layer 50 may be formed by SOG, SiO, SiON, SiOCN or fluoride-doped silicate glass (FSG) may be used as the isolation insulating layer in some embodiments.

Further, the mask patterns 105 and a top portion of the isolation insulating layer 50 are removed by, for example, a chemical mechanical polishing (CMP) method or other planarization methods such as an etch-back process. The resultant structure is shown in FIG. 6.

After forming the isolation insulating layer 50, a thermal process, for example, an anneal process, may be performed to improve the quality of the isolation insulating layer 50. The thermal process may be performed before or after the planarization operations.

Figure 7:
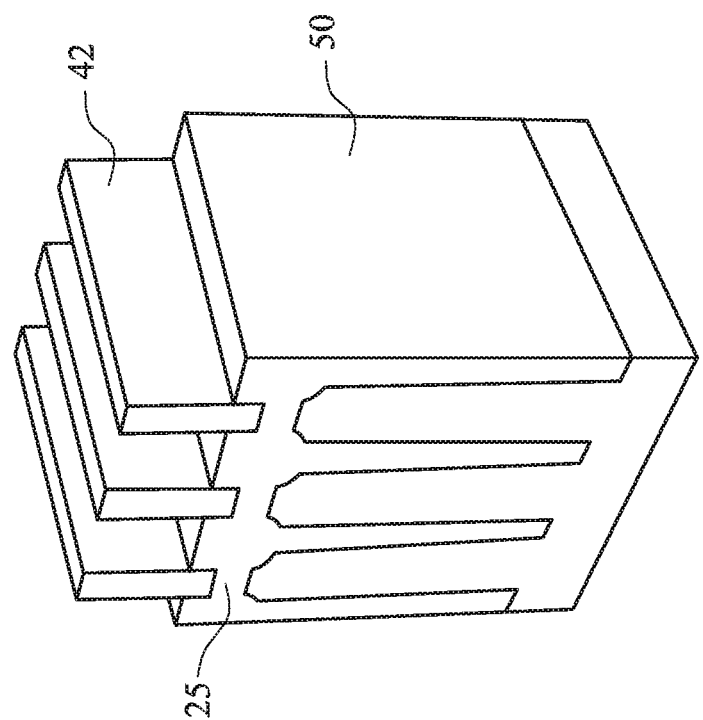

As shown in FIG. 7, the thickness of the isolation insulating layer 50 is reduced by, for example, an etch-back process so as to expose a part of the fin structures 40. The exposed part 42 of the fin structure 40 becomes a channel layer of the Fin FET and the embedded part in the isolation insulating layer becomes a well layer 44 of the Fin FET. The etch-back process may be performed by using dry etching or wet etching. By adjusting etching time, a desired thickness of the remaining isolation insulating layer 50 can be obtained.

In FIG. 7, the SiGe oxide layer 25 is not exposed from the isolation insulating layer 50, and the bottom of the channel layer 42 is embedded in the isolation insulating layer 50. However, in some embodiments, the SiGe oxide layer 25 and the entire channel layer 42 may be exposed from the isolation insulating layer 50.

Figure 8:
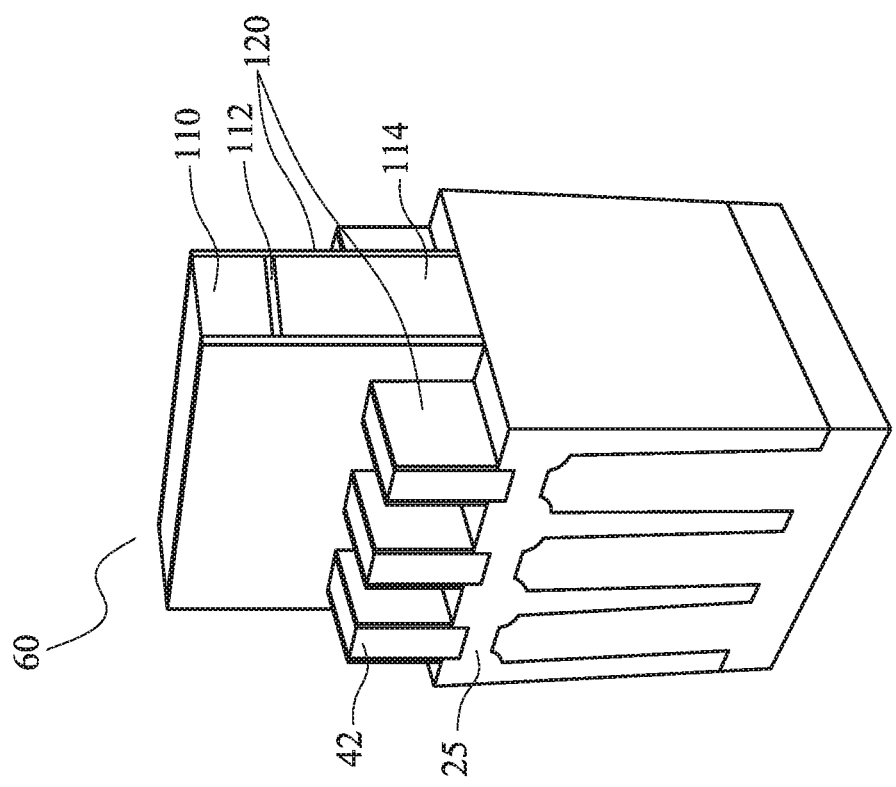

As shown in FIG. 8, a gate structure 60 is formed over part of the channel layers 42 of the fin structures 40. A gate dielectric layer (not shown) and an electrode layer are formed over the isolation insulating layer 50 and the channel layer 42, and then patterning operations are performed so as to obtain gate structure 60 including a gate electrode layer 114 and the gate dielectric layer. The gate electrode layer 114 is poly silicon in this embodiment. The patterning of the poly silicon layer is performed by using a hard mask including a silicon nitride layer 112 and an oxide layer 110 in some embodiments. In other embodiments, the layer 112 may be silicon oxide and the layer 110 may be silicon nitride. The gate dielectric layer may be silicon oxide formed by CVD, PVD, ALD, e-beam evaporation, or other suitable process.

In the following embodiment, a gate-last technology (a gate replacement technology) is employed. In the gate-last technology, the gate electrode layer 114 and the gate dielectric layer formed in the foregoing operations are a dummy electrode layer and a dummy gate dielectric layer, respectively, which are eventually removed.

In the alternative, a gate-first technology may be employed in other embodiments. In such a case, the gate electrode layer 114 and the gate dielectric layer are used as a gate electrode and a gate dielectric layer of a Fin FET. In some embodiments, the gate dielectric layer may include silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm. In some embodiments, the gate electrode layer 114 may comprise a single layer or multilayer structure. Further, the gate electrode layer 114 may be doped poly-silicon with uniform or non-uniform doping. In some alternative embodiments, the gate electrode layer 114 may include a metal such as Al, Cu, W, Ti, Ta, TiN, TiAl, TiAlN, TaN, NiSi, CoSi, other conductive materials with a work function compatible with the substrate material, or combinations thereof. The electrode layer for the gate electrode layer 114 may be formed using a suitable process such as ALD, CVD, PVD, plating, or combinations thereof.

The width of the gate electrode layer 114 is in the range of about 30 nm to about 60 nm in some embodiments.

Further, as shown in FIG. 8, side wall insulating layers 120 are formed over side walls of the gate structure 60 and side walls of the channel layer 42 not covered by the gate structure 60. The material of the side wall insulating layers 120 is silicon nitride in this embodiment.

To form the side wall insulating layer 120, a layer of silicon nitride is formed over the entire structure by using CVD and etch-back operations are performed.

Figure 9:
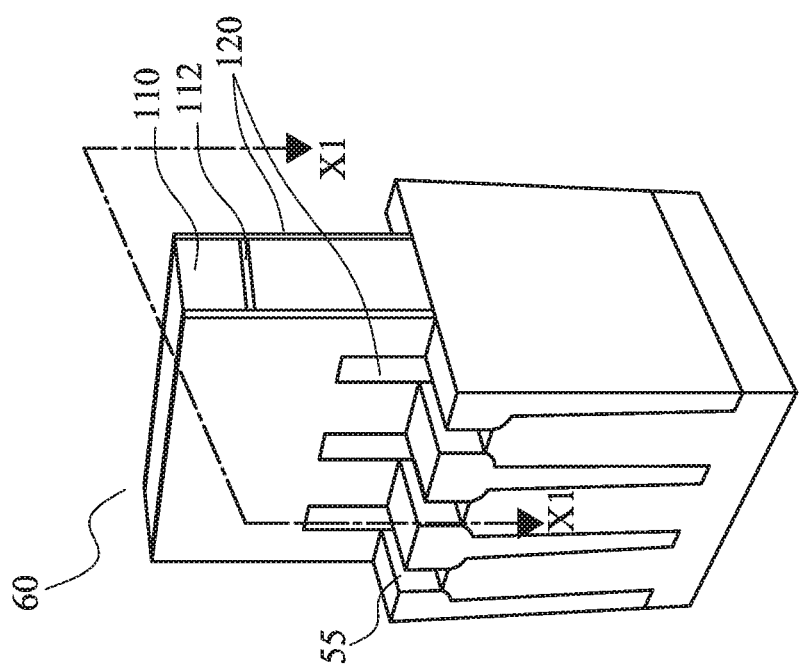

As shown in FIG. 9, the portions of the channel layer 42 not covered by the gate structure 60 are etched to form recessed portions 55. The recessed portions 55 are formed such that the SiGe oxide layer 25 is removed and further a top surface of the well layer 44 of the fin structure 40 is etched. During the recess etching, the side wall insulating layer 120 disposed over the side walls of the fin structure may be removed.

Figure 10:
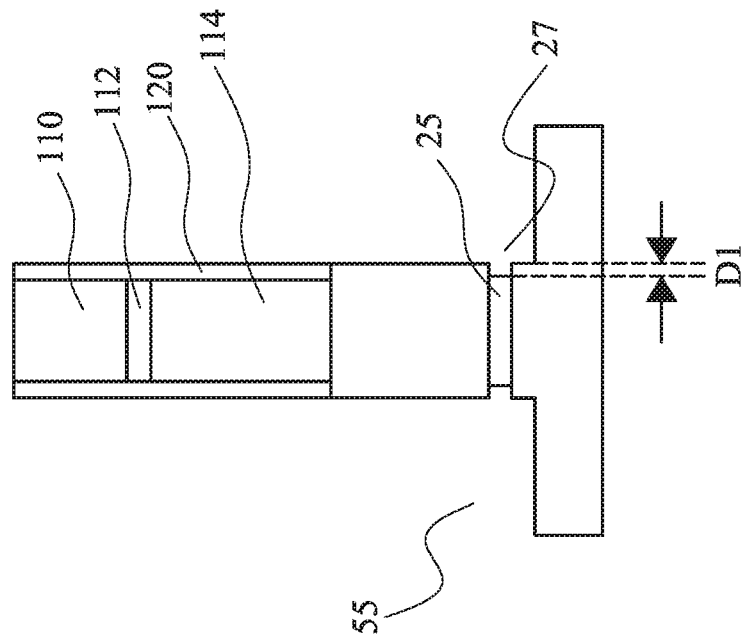

FIG. 10 shows a cross sectional view along line X1-X1 of FIG. 9 cutting one channel layer 42 under the gate structure 60. During the recess etching or by an additional etching process, part of the SiGe oxide below the gate structure 60 is slightly etched to form oxide recess portions 27, within the recessed portion 55. The additional etching process may be wet etching or vapor etching (e.g., plasma etching) using a gas containing fluorine. The width D1 of the oxide recess portions 27 is in a range of about 1 nm to 10 nm in some embodiments, and may be in a range about 2 nm to 7 nm in other embodiments.

Figure 12:
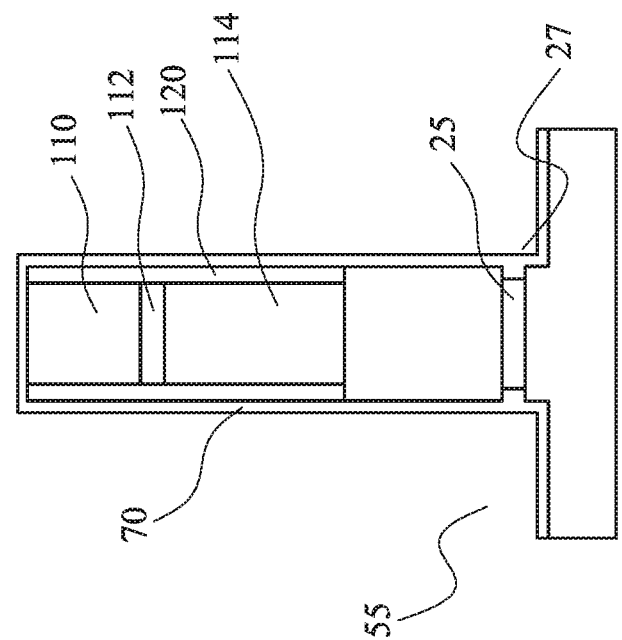
Figure 11:
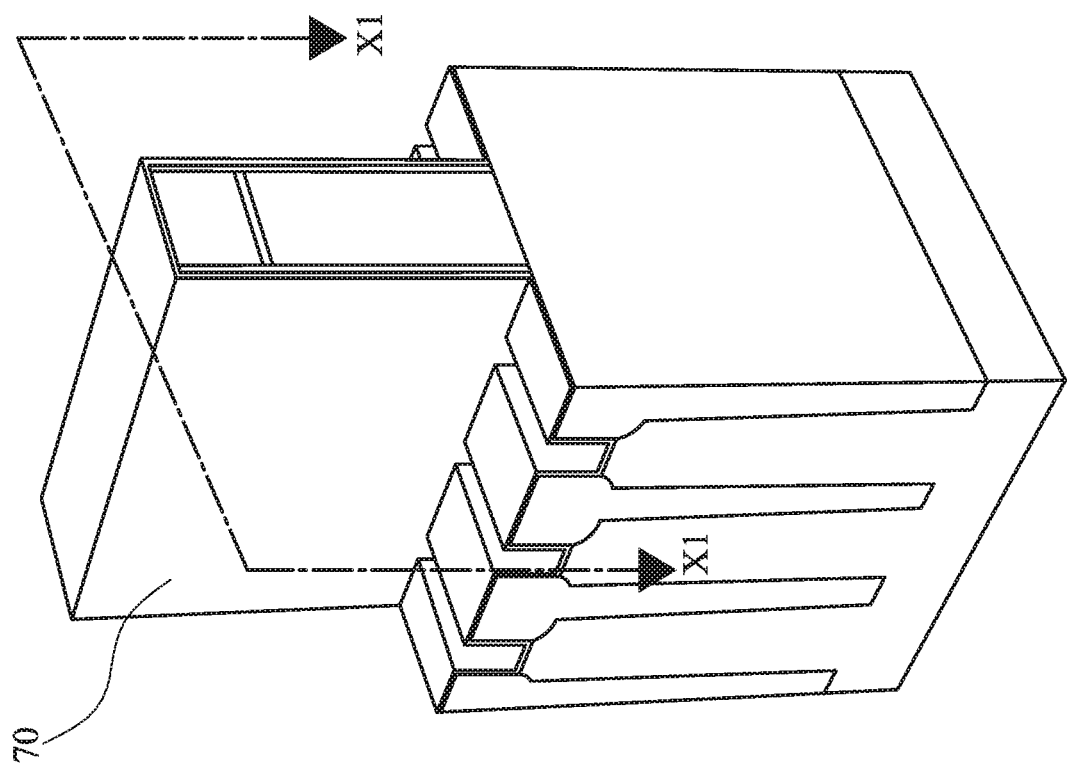

As shown in FIG. 11, an epitaxial seed layer 70 is formed over the resultant structure of FIG. 10. FIG. 12 shows a cross sectional view along line X1-X1 of FIG. 11, similar to FIG. 10. The epitaxial seed layer 70 is formed so as to fill the oxide recess portions 27.

The epitaxial seed layer 70 may be an amorphous semiconductor material, for example, amorphous Si (a-Si), amorphous SiGe (a-SiGe) or amorphous silicon carbide (a-SiC). In this embodiment, a-Si is used. The thickness of a-Si is adjusted so that the oxide recess portion 27 is fully filled with a-Si. The a-Si may be doped or undoped. In this embodiment, undoped a-Si is used. The epitaxial seed layer 70 may be polycrystalline materials of Si, SiC or SiGe in other embodiments.

The a-Si may be formed by CVD, plasma-enhanced chemical vapor deposition (PECVD), an atmospheric pressure chemical vapor deposition (APCVD), a low-pressure CVD (LPCVD), a high density plasma CVD (HDPCVD) and/or an atomic layer deposition (ALD), and/or other processes. In this embodiment, an ALD method is used using a silicon containing gas such as $SiH_4$ and/or $Si_2H_6$.

Figure 14:
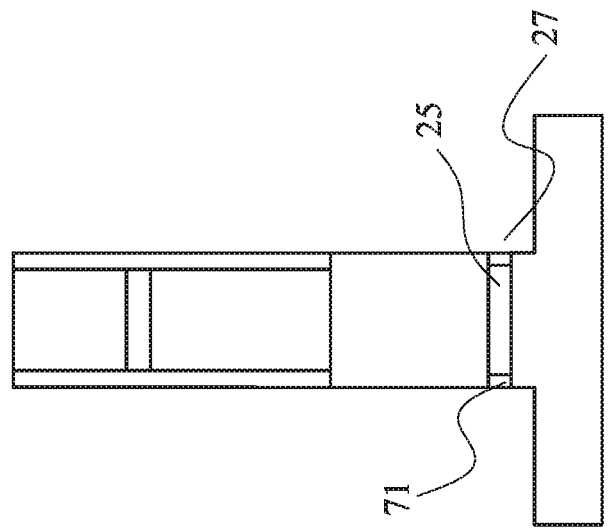
Figure 13:
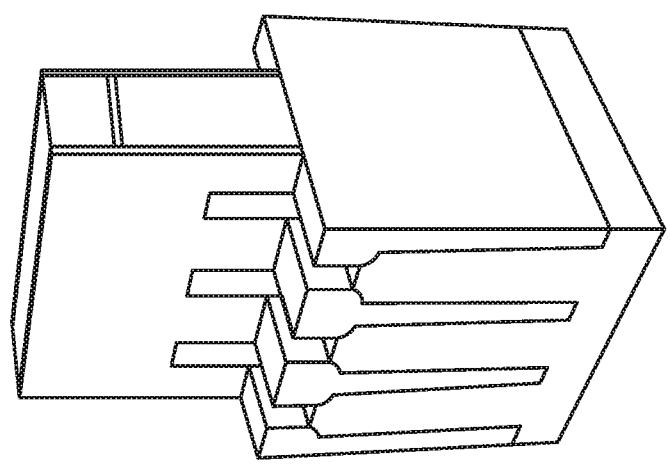

As shown in FIGS. 13 and 14, the epitaxial seed layer 70 is removed leaving embedded seed layers 71 in the oxide recess portions 27. In one embodiment, the epitaxial seed layer 70 is removed by anisotropic dry etching. The embedded seed layers 71 are formed over the SiGe oxide layer 25.

Figure 16:
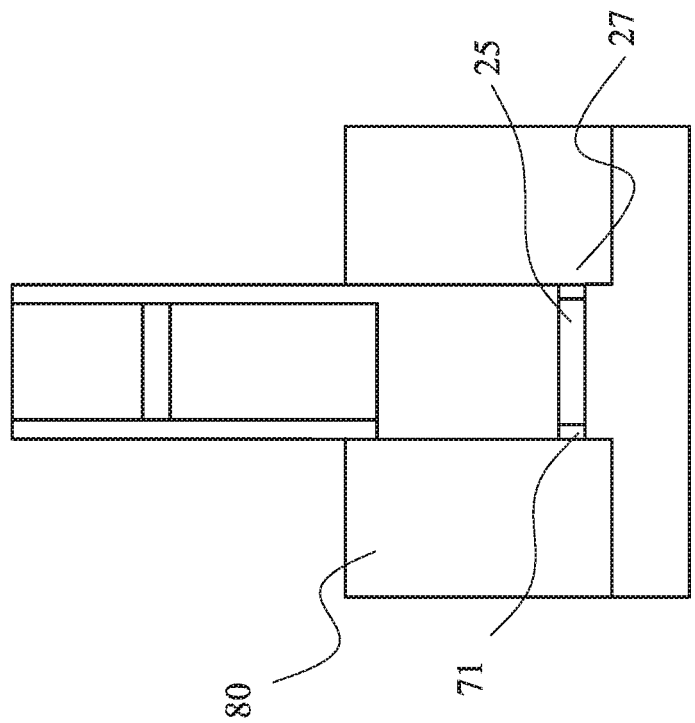
Figure 15:
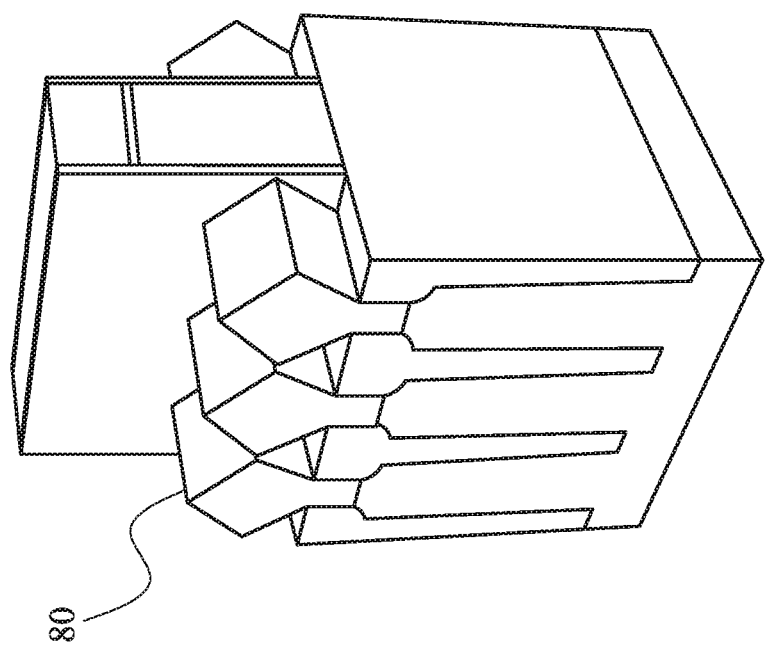

As shown in FIGS. 15 and 16, source/drain epitaxial layers 80 are formed in and over the recessed portion 55. The epitaxial layers 80 may include Si based materials, such as, Si, SiC, SiCP, SiP or SiGe. The epitaxial layer 80 may be a single layer or multiple layers. The epitaxial layer 80 functions as a stressor layer to provide appropriate stress to the channel layer 42 under the gate structure.

Here, if the embedded seed layers 71 are not formed over the SiGe oxide layer, defects such as voids or dislocations may be formed between the SiGe oxide layer 25 and the epitaxial layers 80, because the Si based epitaxial layer 80 is less easily grown on the oxide surface. In contrast, since the surface of SiGe oxide layer 25 is covered by the a-Si embedded seed layers, the epitaxial growth of the Si based material is enhanced.

Figure 17:
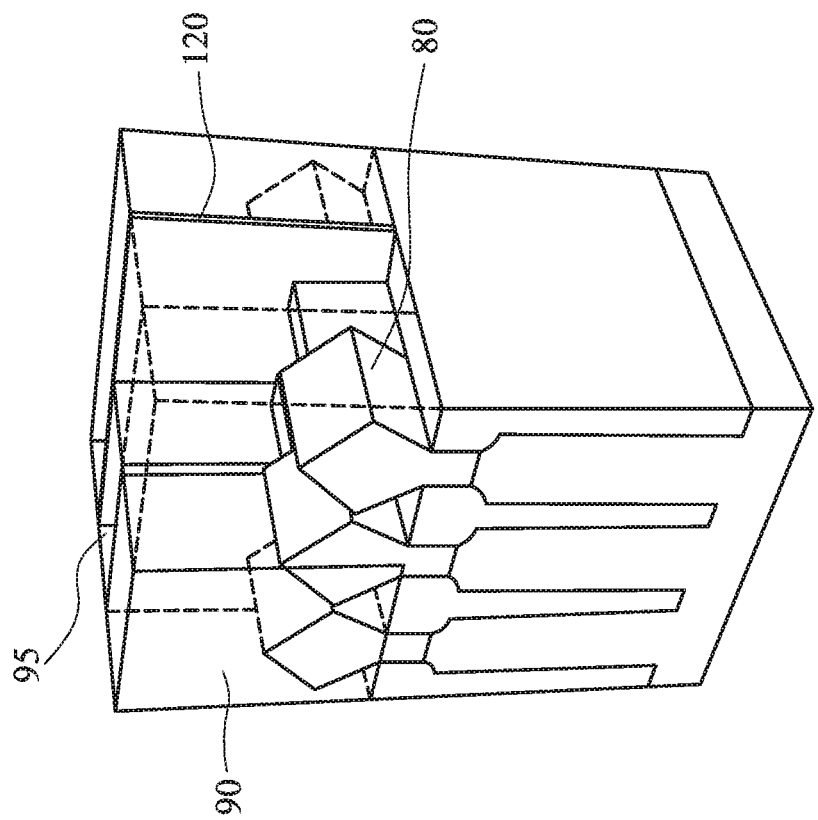

After forming the source/drain epitaxial layers, an interlayer dielectric layer 90 is formed over the structure of FIGS. 15 and 16. The poly silicon gate electrode layer 114 is removed thereby forming a gate electrode space, as shown in FIG. 17. The insulating material for the interlayer dielectric layer 90 may include silicon oxide, silicon nitride, silicon oxynitride (SiON), SiOCN, fluoride-doped silicate glass (FSG), or a low-K dielectric material, formed by CVD.

Figure 18:
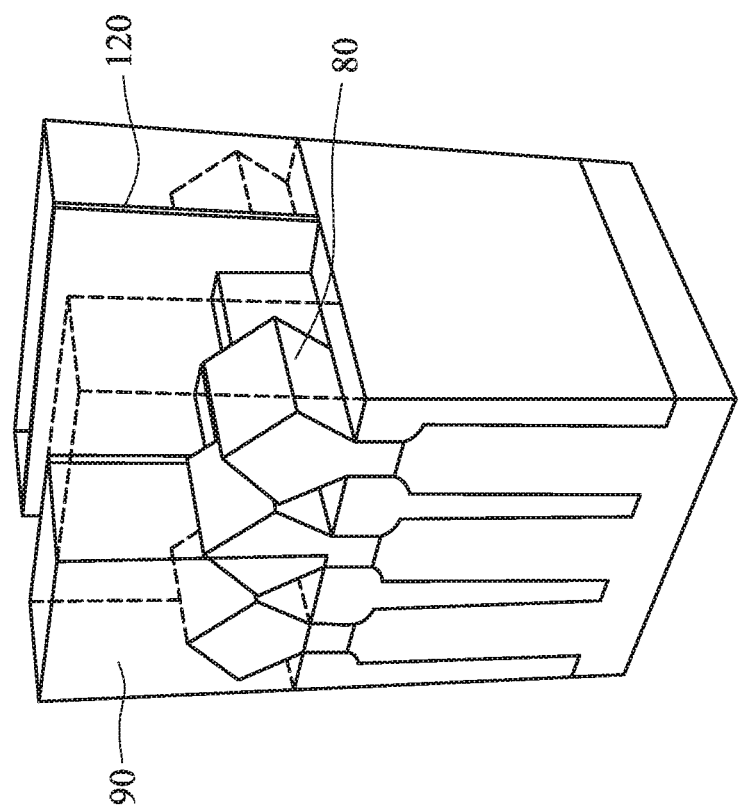

As shown in FIG. 18, a metal gate structure 95 is formed in the gate electrode space. The metal structure 95 includes a metal gate electrode layer and a gate dielectric layer. The metal gate electrode layer may include a single layer or multilayer structure. In the present embodiment, the metal gate electrode layer includes a metal such as Al, Cu, W, Ti, Ta, TiN, TiAl, TiAlN, TaN, NiSi, CoSi, other conductive materials with a work function compatible with the substrate material, or combinations thereof. The metal gate electrode layer may be formed using a suitable process such as ALD, CVD, PVD, plating, or combinations thereof. The width of the metal gate electrode layer is in the range of about 30 nm to about 60 nm in some embodiments. In some embodiments, the gate dielectric layer may include silicon nitride, silicon oxy-nitride, or high-k dielectric materials. High-k dielectric materials comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the gate dielectric layer is in the range of about 1 nm to 5 nm.

Figure 19:
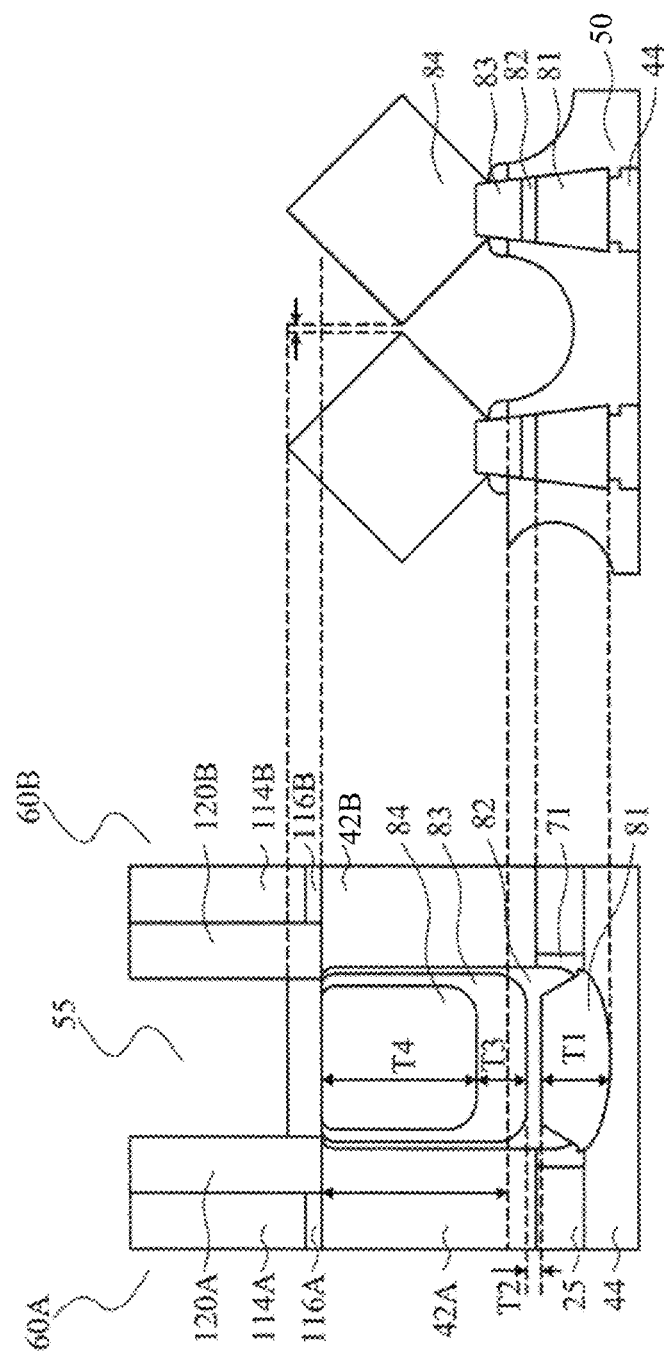
FIGS. 19A and 19B are exemplary cross sectional views of an n-type Fin FET device according to one embodiment of the present disclosure.

FIGS. 19A and 19B show exemplary cross sectional views of a structure of source (drain) of an n-type Fin FET after the source/drain epitaxial layers are formed, according to one embodiment of the present disclosure. FIG. 19A shows a cross sectional view cutting the gate electrode structure and the source (drain) along the direction in which the fin structures extend, and FIG. 19B shows a cross sectional view cutting the sources (drains) along the direction in which the gate electrode structures extend.

In FIG. 19A, the source is formed between two gate electrode structures 60A and 60B (e.g., a shared source (drain) structure). The gate electrode structure 60A includes a poly silicon gate electrode layer 114A, a side wall insulating layer 120A and a gate oxide layer 116A. The gate electrode structure 60B includes a poly silicon gate electrode layer 114B, a side wall insulating layer 120B and a gate oxide layer 116B. In FIG. 19B, two fin structures are illustrated.

In the recessed portion 55 formed between the channel layer 42A and 42B, multiple epitaxial layers are formed in this embodiment. The SiGe oxide layer 25 is disposed between channel layers 42A, 42B and well layer 44. The embedded seed layer 71 is disposed on the SiGe oxide layer 25.

The first epitaxial layer 81 may include a Si epitaxial layer formed over the well layer 44. The thickness T1 of the first epitaxial layer 81 is in a range of about 5 nm to about 30 nm in some embodiments. The first epitaxial layer 81 is an undoped Si layer in this embodiment.

The second epitaxial layer 82 may include a SiC epitaxial layer formed over the first epitaxial layer 81. The thickness T2 of the second epitaxial layer 82 is in a range of about 5 nm to about 10 nm in some embodiments. The carbon content of the SiC second epitaxial layer 82 is in a range of about 0.5% to about 1% in some embodiments.

Since the surface of the SiGe oxide layer 25 is covered by the embedded a-Si seed layer 71, the first and/or second epitaxial layers can be formed without forming voids.

The third epitaxial layer 83 may include a SiP epitaxial layer formed over the second epitaxial layer 82. The thickness T3 of the third epitaxial layer 83 is in a range of about 5 nm to about 10 nm in some embodiments. The phosphorous content of the SiP third epitaxial layer 83 is in a range of about $2\times10^{20}$ cm$^{-3}$ to about $8\times10^{20}$ cm$^{-3}$ in some embodiments.

The fourth epitaxial layer 84 may include a SiP epitaxial layer formed over the third epitaxial layer 83. The fourth epitaxial layer 84 is formed above the height of the channel layer 42A, 42B and above the isolation insulating layer 50. The thickness T4 of the fourth epitaxial layer 84 is in a range of about 20 nm to about 50 nm in some embodiments. The phosphorous content of the SiP fourth epitaxial layer 84 is larger than that of the SiP third epitaxial layer and in a range of about $1\times10^{21}$ cm$^{-3}$ to about $3\times10^{21}$ cm$^{-3}$ in some embodiments.

The second to fourth epitaxial layers apply tensile stress to the channel layer of the n-type Fin FET to enhance carrier mobility.

Figure 20:
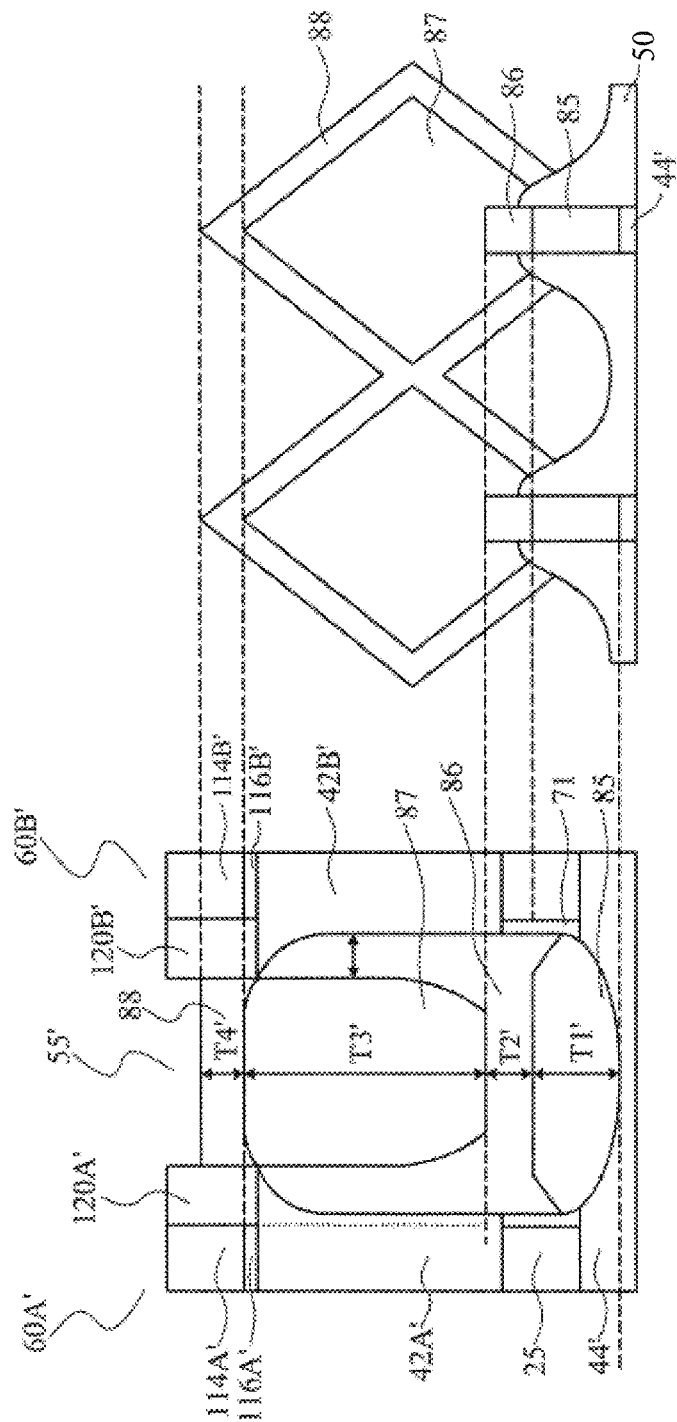
FIGS. 20A and 20B are exemplary cross sectional of a p-type Fin FET device according to one embodiment of the present disclosure.

FIGS. 20A and 20B show exemplary cross sectional views of a structure of source (drain) of a p-type Fin FET after the source/drain epitaxial layers are formed, according to one embodiment of the present disclosure. FIG. 20A shows a cross sectional view cutting the gate electrode structure and the source (drain) along the direction in which the fin structures extend, and FIG. 20B shows a cross sectional view cutting the sources (drains) along the direction in which the gate electrode structures extend.

In FIG. 20A, the source is formed between two gate electrode structures 60A' and 60B' (e.g., a shared source (drain) structure). The gate electrode structure 60A' includes a poly silicon gate electrode layer 114A', a side wall insulating layer 120A' and a gate oxide layer 116A'. The gate electrode structure 60B' includes a poly silicon gate electrode layer 114B', a side wall insulating layer 120B' and a gate oxide layer 116B'. In FIG. 20B, two fin structures are illustrated.

In the recessed portion 55' formed between the channel layer 42A' and 42B', multiple epitaxial layers are formed in this embodiment. The SiGe oxide layer 25 is disposed between channel layers 42A', 42B' and well layer 44'. The embedded seed layer 71 is disposed on the SiGe oxide layer 25.

The first epitaxial layer 85 may include a SiGe epitaxial layer formed over the well layer 44. The thickness T1' of the first epitaxial layer 85 is in a range of about 5 nm to about 30 nm in some embodiments. The Ge content of the first epitaxial layer 85 is in a range of about 20% to about 30% in some embodiments. The SiGe first epitaxial layer 85 may be undoped.

The second epitaxial layer 86 may include a SiGe epitaxial layer formed over the first epitaxial layer 85. The thickness T2' of the second epitaxial layer 86 is in a range of about 5 nm to about 15 nm in some embodiments. The Ge content of the SiGe second epitaxial layer 86 is in a range of about 20% to about 30% in some embodiments. The SiGe second epitaxial layer 86 may include p-type impurities such as boron (B) in an amount of about $2\times10^{20}$ cm$^{-3}$ to about $6\times10^{20}$ cm$^{-3}$ in some embodiments.

Since the surface of the SiGe oxide layer 25 is covered by the embedded a-Si seed layer 71, the first and/or second epitaxial layers can be formed without forming voids.

The third epitaxial layer 87 may include a SiGe epitaxial layer formed over the second epitaxial layer 86. The thickness T3 of the third epitaxial layer 87 is in a range of about 20 nm to about 40 nm in some embodiments. The Ge content of the SiGe third epitaxial layer 87 is larger than that of the SiGe second epitaxial layer 86 and in a range of about 40% to about 70% in some embodiments. The SiGe third epitaxial layer 87 may include p-type impurities such as boron (B) in an amount of about $7\times10^{20}$ cm$^{-3}$ to about $2\times10^{21}$ cm$^{-3}$ in some embodiments. The impurity amount in the SiGe third epitaxial layer 87 is larger than that in the second SiGe epitaxial layer 86.

The fourth epitaxial layer 88 may include a SiGe or Ge epitaxial layer formed over the third epitaxial layer 87. The third and fourth epitaxial layers are formed above the height of the channel layer 42A', 42B' and above the isolation insulating layer 55. The thickness T4 of the fourth epitaxial layer 88 is in a range of about 5 nm to about 10 nm in some embodiments. The Ge content of the SiGe fourth epitaxial layer 88 is larger than that of the SiGe third epitaxial 87 layer and in a range of about 30% to about 100% (i.e., a Ge layer). The SiGe fourth epitaxial layer 88 may include p-type impurities such as boron (B) in an amount of about $5\times10^{20}$ cm$^{-3}$ to about $2\times10^{21}$ cm$^{-3}$ in some embodiments. The impurity amount in the SiGe fourth epitaxial layer 88 is smaller than that in the third SiGe epitaxial layer 87.

The second to fourth epitaxial layers apply compressive stress to the channel layer of the p-type Fin FET to enhance carrier mobility.

It is understood that the Fin FET device may undergo further CMOS processes to form various features such as contacts/vias, interconnect metal layers, dielectric layers, passivation layers, etc.

FIGS. 21-28 show exemplary processes for manufacturing a semiconductor FET device having a fin structure (Fin FET) according to another embodiment of the present disclosure. It is understood that additional operations can be provided before, during, and after processes shown by FIGS. 21-28, and some of the operations described below can be replaced or eliminated, for additional embodiments of the method. The order of the operations/processes may be interchangeable. The materials, dimensions, properties, processes and/or operations of the above embodiments explained with FIGS. 1-20 may be applied to the following embodiments, and the detailed explanation thereof may be omitted in the following descriptions.

Figure 21:
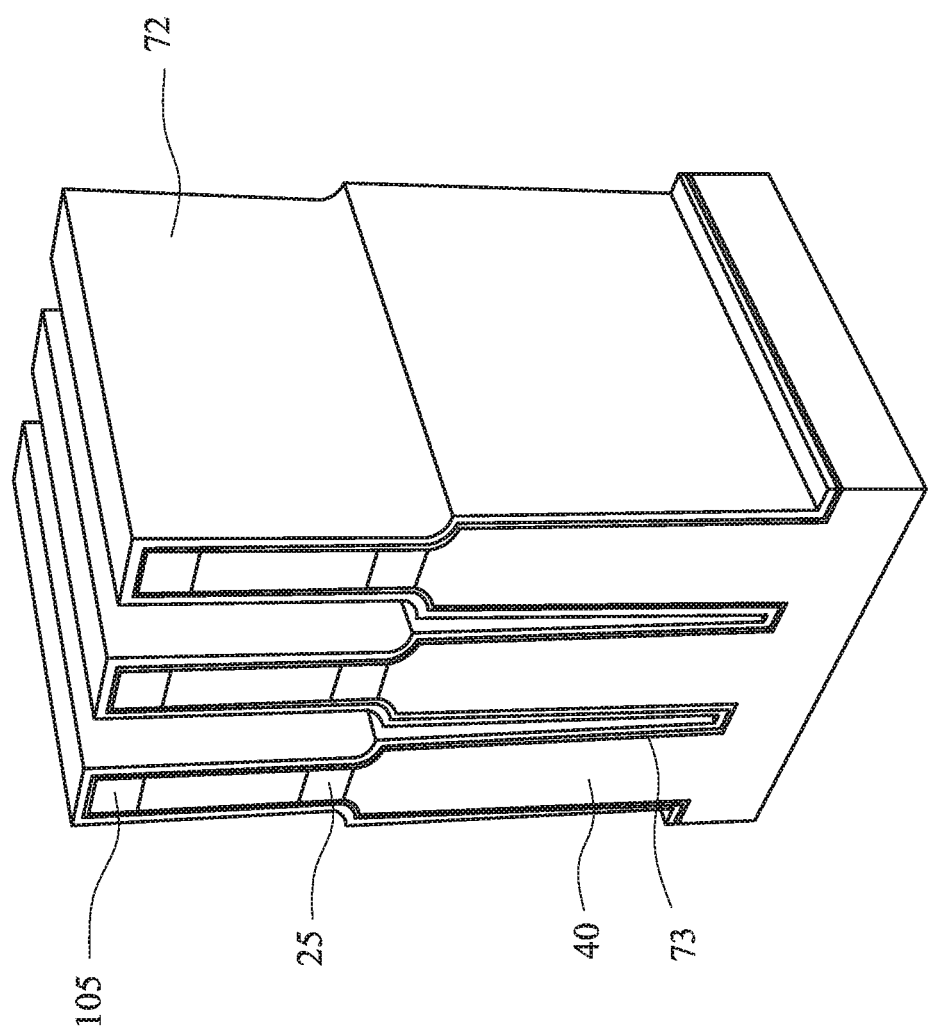

After the fabrication operation shown in FIG. 5, as shown in FIG. 21, a pad layer 73 and an epitaxial seed layer 72 are formed over the resultant structure of FIG. 5. The pad layer 73 may be a dielectric material such as silicon oxide, silicon oxynitride or silicon nitride. In this embodiment, silicon oxide is used as the pad layer 73. The pad layer 73 is formed on the fin structures, by thermal oxidation, CVD or other appropriate methods. The thickness of the pad layer 73 is in a range of 2 nm to 9 nm in some embodiments.

The epitaxial seed layer 72 is formed over the pad layer 73 and may be an amorphous semiconductor material, for example, amorphous Si (a-Si), amorphous SiGe (a-SiGe) or amorphous silicon carbide (a-SiC). In this embodiment, a-Si is used. The thickness of a-Si seed layer is in a range of about 1 nm to 10 nm in some embodiments, or in a rage of about 1 nm to 3 nm in other embodiments. The a-Si may be doped or undoped. In this embodiment, undoped a-Si is used. The epitaxial seed layer 72 may be polycrystalline materials of Si, SiC or SiGe in other embodiments.

Figure 22:
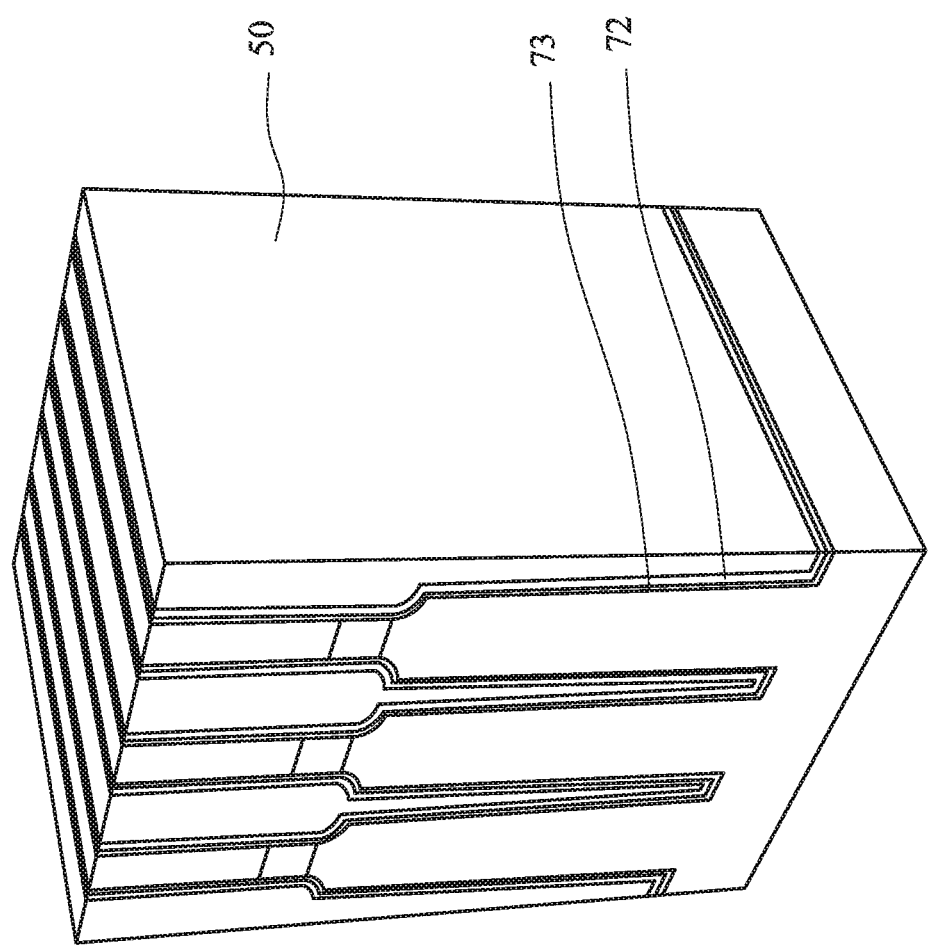

Similar to FIG. 6, an isolation insulating layer 50 is formed. Further, the mask patterns 105, the epitaxial seed layer 72 formed on the top of the fin structures and a top portion of the isolation insulating layer 50 are removed by, for example, a chemical mechanical polishing (CMP) method or other planarization methods such as an etch-back process. The resultant structure is shown in FIG. 22.

Figure 23:
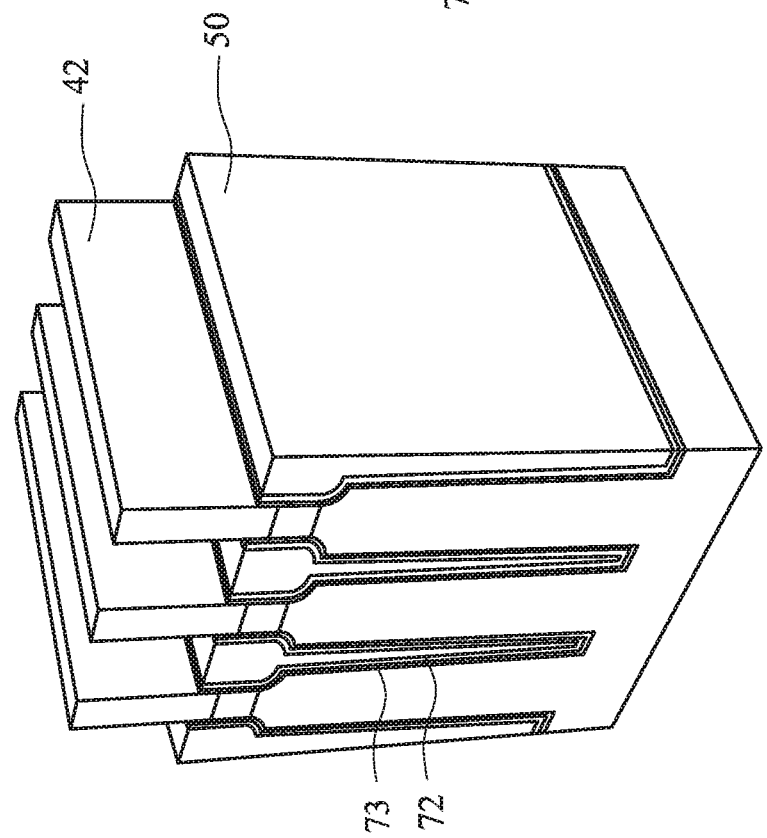

Similar to FIG. 7, the thickness of the isolation insulating layer 50 is reduced by, for example, an etch-back process so as to expose a part of the fin structures 40, as shown in FIG. 23. The exposed part 42 of the fin structure 40 becomes a channel layer of the Fin FET. The etch-back process may be performed by using dry etching or wet etching. By adjusting etching time, a desired thickness of the remaining isolation insulating layer 50 can be obtained. In FIG. 23, the SiGe oxide layer 25 is not exposed from the isolation insulating layer 50. In other words, the bottom of the channel layer 42 is embedded in the isolation insulating layer 50. However, in some embodiments, the SiGe oxide layer 25 may be exposed from the isolation insulating layer 50. In this embodiment, the thickness of the SiGe oxide layer 25 is in a range of about 3 nm to about 20 nm.

Figure 24:
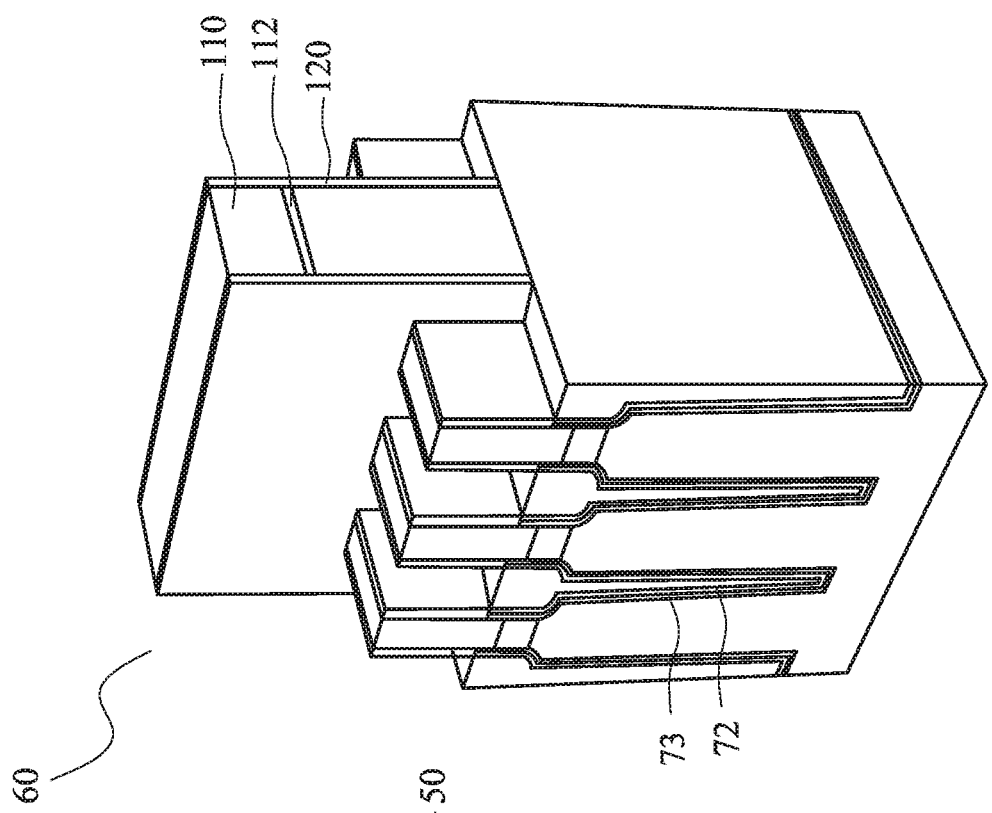

Similar to FIG. 8, a gate structure 60 is formed over part of the channel layers 42 of the fin structures 40, as shown in FIG. 24.

Figure 25B:
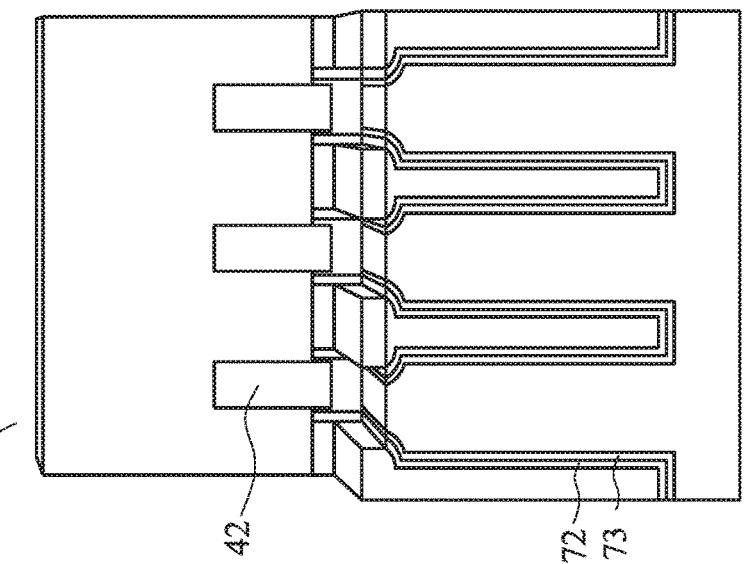
Figure 25A:
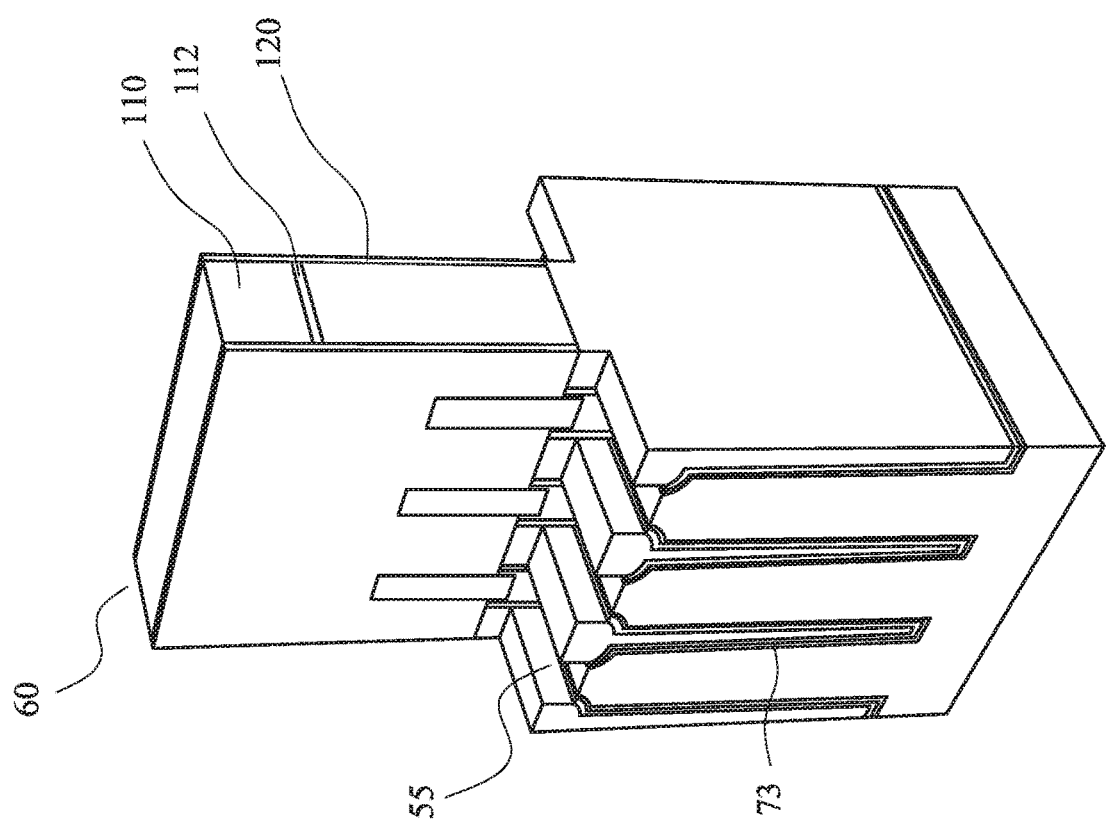

Similar to FIG. 9, the portions of the channel layer 42 not covered by the gate structure 60 are etched to form recessed portions 55, as shown in FIG. 25A. The recessed portions 55 are formed such that the SiGe oxide layer 25 is removed and further a top surface of the well layer 44 of the fin structure 40 is etched. During the recess etching, the side wall insulating layer 120 disposed over the side walls of the fin structure may be removed. In forming the recessed portion 55, the height of the isolation insulating layer 50 may be reduced by the depth D2 (see, FIG. 25C). The depth D2 is in a range about 20 nm to about 50 nm. In certain embodiments, the depth D2 is approximately zero.

FIG. 25B shows an enlarged view of FIG. 25A, and FIG. 25C is a further enlarged view of FIG. 25B.

As shown in FIGS. 25B and 25C, the epitaxial seed layers 72 are disposed on sides of the SiGe oxide layers 25 under the gate structures 60 and on the bottom of the recessed portion 55.

Figure 26:
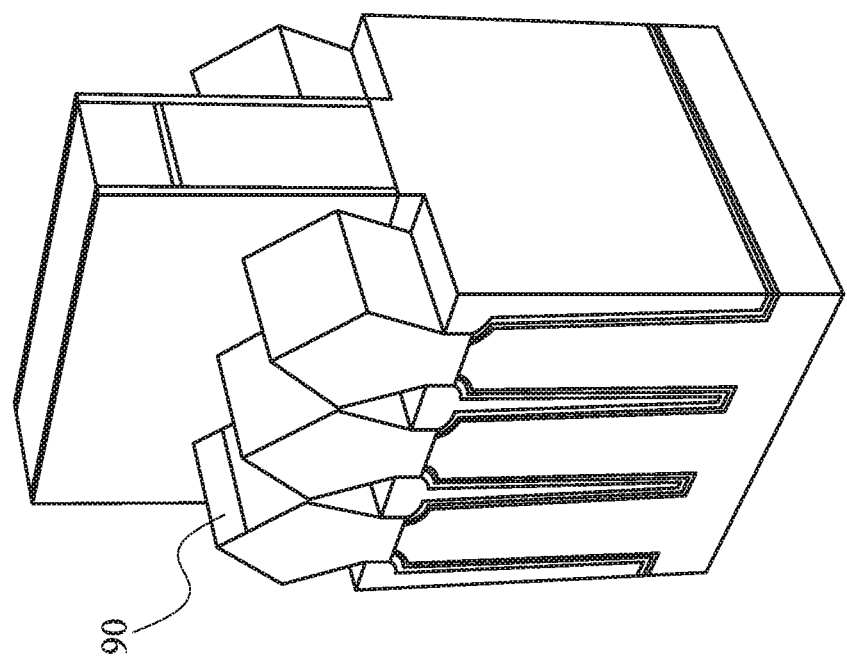

Similar to FIG. 15, source/drain epitaxial layers 80 are formed in and over the recessed portion 55, as shown in FIG. 26. The epitaxial layers 80 may include Si based materials, such as, Si, SiC, SiCP, SiP or SiGe. The epitaxial layer 80 may be a single layer or multiple layers. The epitaxial layer 80 functions as a stressor layer to provide appropriate stress to the channel layer 42 under the gate structure.

Here, if the epitaxial seed layers 72 are not formed over the sides of the SiGe oxide layer 25 and/or the bottom of the recessed portion 55, defects such as voids or dislocations may be formed between the SiGe oxide layer 25 and the epitaxial layers 80 and/or at the corners of the bottom of the recessed portion 55, because the Si based epitaxial layer 80 is less easily grown on the oxide surface. In contrast, since the surface of SiGe oxide layer 25 is covered by the epitaxial seed layers 72, the epitaxial growth of the Si based material is enhanced. The structures of the epitaxial layer may be substantially the same as the embodiments shown in FIGS. 19A, 19B, 20A and 20B.

Figure 27:
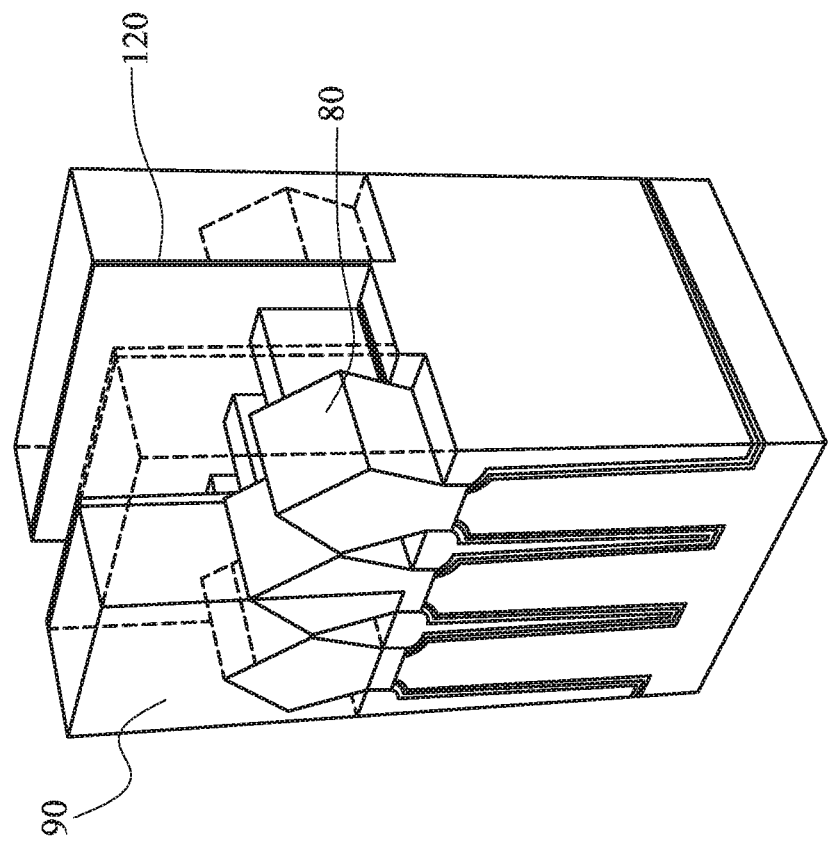

Similar to FIG. 17, after forming the source/drain epitaxial layers, an interlayer dielectric layer 90 is formed over the structure of FIG. 26. The poly silicon gate electrode layer 114 is removed thereby forming a gate electrode space, as shown in FIG. 27. The insulating material for the interlayer dielectric layer 90 may include silicon oxide, silicon nitride, silicon oxynitride (SiON), SiOCN, fluoride-doped silicate glass (FSG), or a low-K dielectric material, formed by CVD.

As shown in FIG. 28, a metal gate structure 95 is formed in the gate electrode space, similar to FIG. 18.

It is understood that the Fin FET device may undergo further CMOS processes to form various features such as contacts/vias, interconnect metal layers, dielectric layers, passivation layers, etc.

The various embodiments or examples described herein offer several advantages over the existing art. In some embodiments of the present disclosure, an epitaxial seed layer is formed on a surface of the SiGe oxide layer in the fin structure such that epitaxial layers later formed does not contact the SiGe oxide layer. Accordingly, defects such as voids or dislocations can be avoided in forming the epitaxial layers. Further, in other embodiments, an epitaxial seed layer is formed on side surfaces of the SiGe oxide layer in the fin structure, epitaxial layers can more easily be grown in the recessed portion of the fin structure. Accordingly, defects such as voids or dislocations can be avoided in forming the epitaxial layers.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device includes forming a fin structure including a well layer, an oxide layer disposed over the well layer and a channel layer disposed over the oxide layer. An isolation insulating layer is formed so that the channel layer of the fin structure protrudes from the isolation insulating layer and at least a part of the oxide layer or an entirety of the oxide layer is embedded in the isolation insulating layer. A gate structure is formed over a part of the fin structure and over the isolation insulating layer. A recessed portion is formed by etching a part of the fin structure not covered by the gate structure such that the oxide layer is exposed. A recess is formed in the exposed oxide layer. An epitaxial seed layer is formed in the recess in the oxide layer. An epitaxial layer is formed in and above the recessed portion. The epitaxial layer is in contact with the epitaxial seed layer.

In accordance with another aspect of the present disclosure, a method for manufacturing a semiconductor device includes forming a fin structure including a well layer, an oxide layer disposed over the well layer and a channel layer disposed over the oxide layer. An epitaxial seed layer is formed over the fin structures having the oxide layer. An isolation insulating layer is formed so that the channel layer of the fin structure protrudes from the isolation insulating layer and at least a part of the oxide layer or an entirety of the oxide layer is embedded in the isolation insulating layer. A gate structure is formed over a part of the fin structure and over the isolation insulating layer. A recessed portion is formed by etching a part of the fin structure not covered by the gate structure such that the oxide layer and the epitaxial seed layer formed on a side of the oxide layer are exposed. An epitaxial layer is formed in and above the recessed portion. The epitaxial layer is in contact with the epitaxial seed layer formed on a side of the oxide layer.

In accordance with another aspect of the present disclosure, a semiconductor device includes a Fin FET device. The Fin FET device includes a fin structure extending in a first direction and protruding from an isolation insulating layer. The fin structure and the isolation insulating layer are disposed over a substrate. The fin structure includes a well layer, an oxide layer disposed over the well layer and a channel layer disposed over the oxide layer. The Fin FET device further includes a gate stack. The gate stack includes a gate electrode layer and a gate dielectric layer, covers a portion of the fin structure and extends in a second direction perpendicular to the first direction. The Fin FET device further includes a source and a drain, each including a stressor layer disposed in and over recessed portions formed in the fin structure. The stressor layer applies a stress to a channel layer of the fin structure under the gate stack. The Fin FET device also includes epitaxial seed layers formed in contact with the oxide layer in the recessed portions. The stressor layer is in contact with the epitaxial seed layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Fin Field-Effect Transistor (Fin FET) device, comprising:
   a fin structure including a well layer, an oxide layer, and a channel layer sequentially stacked on each other;
   a gate stack including a gate electrode layer covering a portion of the fin structure;
   first and second seed layers formed on side surfaces of the oxide layer;
   a source disposed on a first side of the channel layer, and protruding from the well layer and the first and second seed layers; and
   a drain disposed on a second side of the channel layer opposing the first side, and protruding from the well layer and the first and second seed layers,
   wherein the source and the drain contact the oxide layer.

2. The Fin FET device of claim 1, wherein the oxide layer includes SiGe oxide.

3. The Fin FET device of claim 1, wherein the first and second seed layers include amorphous silicon.

4. The Fin FET device of claim 1, wherein:
   the Fin FET device is an n-type Fin FET, and
   the source and the drain include at least one of SiC, SiCP and SiP.

5. The Fin FET device of claim 1, wherein:
   the Fin FET device is a p-type Fin FET, and
   the source and the drain include at least one of SiGe and Ge.

6. The Fin FET device of claim 1, wherein the source and the drain include first bottom portions filling the recessed portions of the fin structure, and second upper portions having a width first increasing and then decreasing in a direction from the well layer to the channel layer.

7. The Fin FET device of claim 1, wherein a width of the first and second seed layers is 1 nm to 10 nm.

8. The Fin FET device of claim 1, wherein:
   the first and second seed layers are disposed at a level above interfaces between the source and the well layer and between the drain and the well layer.

9. A Fin Field-Effect Transistor (Fin FET) device; comprising:
   an isolation insulating layer;
   a fin structure including a well layer, an oxide layer, and a channel layer sequentially stacked on each other;
   first and second seed layers disposed at least on side surfaces of the well layer to separate the side surfaces of the well layer from the isolation insulating layer;
   a gate stack including a gate electrode layer covering a portion of the fin structure;
   a source disposed on a first side of the channel layer, and protruding from the well layer and the first and second seed layers; and
   a drain disposed on a second side of the channel layer opposing the first side, and protruding from the well layer and the first and second seed layers.

10. The Fin FET device of claim 9, wherein the oxide layer includes SiGe oxide.

11. The Fin FET device of claim 9, wherein the first and second seed layers include amorphous silicon.

12. The Fin FET device of claim 9, wherein:
   the Fin FET device is an n-type Fin FET, and
   the source and the drain include at least one of SiC, SiCP and SiP.

13. The Fin FET device of claim 9, wherein:
   the Fin FET device is a p-type Fin FET, and
   the source and the drain include at least one of SiGe and Ge.

14. The Fin FET device of claim 9, wherein the source and the drain include first bottom portions filling the recessed portions of the fin structure, and second upper portions having a width first increasing and then decreasing in a direction from the well layer to the channel layer.

15. The Fin FET device of claim 9, wherein a width of the first and second seed layers is 1 nm to 10 nm.

16. A Fin Field-Effect Transistor (Fin FET) device, comprising:
a fin structure including a well layer, an oxide layer, and a channel layer sequentially stacked on each other;
first and second seed layers disposed on side surfaces of the well layer and side surfaces of the oxide layer;
a first dielectric layer disposed between the first seed layer and the well layer and a second dielectric layer disposed between the second seed layer and the well layer;
a gate stack including a gate electrode layer covering a portion of the fin structure;
a source disposed on a first side of the channel layer, and protruding from the well layer and the first and second seed layers; and
a drain disposed on a second side of the channel layer opposing the first side, and protruding from the well layer and the first and second seed layers.

17. The Fin FET device of claim 16, wherein the oxide layer includes SiGe oxide.

18. The Fin FET device of claim 16, wherein the first and second seed layers include amorphous silicon.

19. The Fin FET device of claim 16, wherein:
the Fin FET device is an n-type Fin FET, and
the source and the drain include at least one of SiC, SiCP and SiP.

20. The Fin FET device of claim 16, wherein:
the Fin FET device is a p-type Fin FET, and
the source and the drain include at least one of SiGe and Ge.

* * * * *